(12) United States Patent
Ishiwata et al.

(10) Patent No.: US 6,504,193 B1
(45) Date of Patent: Jan. 7, 2003

(54) SOLID-STATE IMAGE DEVICE AND METHOD OF MANUFACTURING THE SAME

(75) Inventors: Hiroaki Ishiwata, Kawasaki (JP); Yoshinori Iida, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/606,178

(22) Filed: Jun. 29, 2000

(30) Foreign Application Priority Data

Jun. 30, 1999 (JP) .......................... 11-185848

(51) Int. Cl.⁷ .............. H01L 31/062; H01L 31/113
(52) U.S. Cl. .............. 257/291; 257/292; 257/461; 257/462
(58) Field of Search ................ 257/232, 233, 257/234, 291, 292, 461, 462

(56) References Cited

U.S. PATENT DOCUMENTS

| | | | |
|---|---|---|---|
| 5,625,210 A | * | 4/1997 | Lee et al. .................. 257/292 |
| 5,880,495 A | * | 3/1999 | Chen .......................... 257/233 |
| 6,023,081 A | * | 2/2000 | Drowley et al. ............ 257/292 |
| 6,281,531 B1 | * | 8/2001 | Kamashita et al. ......... 257/258 |

FOREIGN PATENT DOCUMENTS

| JP | 11-274458 | 10/1999 |
|---|---|---|
| JP | 11-284166 | 10/1999 |

* cited by examiner

*Primary Examiner*—Ngân V. Ngô
(74) *Attorney, Agent, or Firm*—Oblon, Spivak, McClelland, Maier & Neustadt, P.C.

(57) ABSTRACT

Part of a photodiode layer extends to a position under a gate electrode. The photodiode layer and a drain layer are separated by a punch-through stopper region. A surface shield layer is formed on the photodiode layer. When a voltage is applied to the gate electrode, the charge accumulated in the photodiode layer is transferred to the drain region via a channel formed under the gate electrode, not being affected by a potential barrier in the surface shield layer.

13 Claims, 6 Drawing Sheets

SOLID-STATE IMAGE DEVICE AND METHOD OF MANUFACTURING THE SAME

CROSS-REFERENCE TO RELATED APPLICATIONS

This application is based upon and claims the benefit of priority from the prior Japanese Patent Application No. 11-185848, filed Jun. 30, 1999, the entire contents of which are incorporated herein by reference.

BACKGROUND OF THE INVENTION

This invention relates to solid-state image device which is used in CCD (Charge Coupled Device) and CMOS image sensors.

A cause of noise included in signals transmitted from a solid-state image device is the surface recombination phenomenon observed on the surface of the photodiode.

Figure 8:
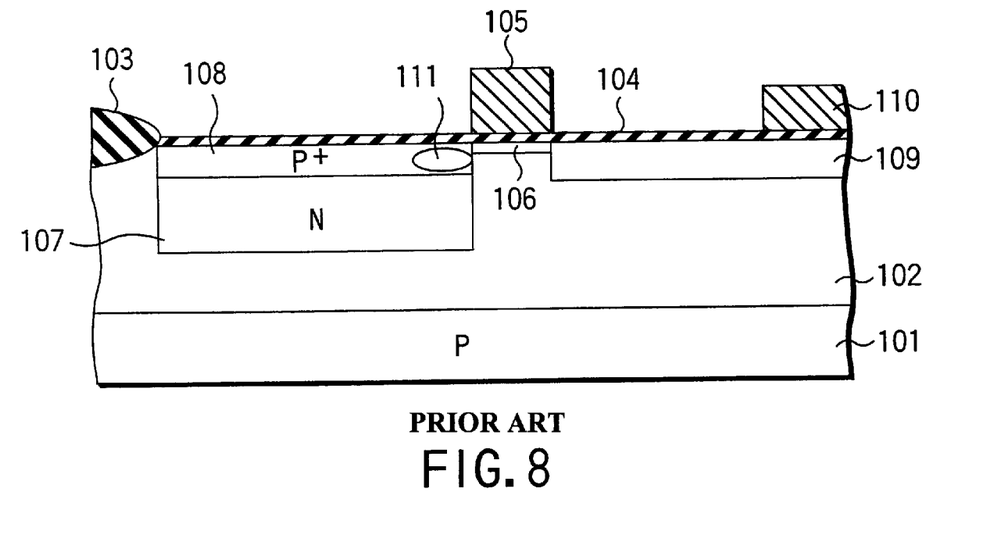
FIG. 8 is a cross sectional view of a CMOS image sensor of conventional art.

FIG. 8 is a schematic diagram illustrating the structure of a CMOS image sensor of conventional art used in a solid-state image device. The CMOS image sensor has in principle a photodiode 107 and a gate electrode 105. The photodiode 107 receives photons, converts them into electric signals, and accumulates electric charge. The gate electrode 105 is used to read out the charge accumulated in the photodiode 107.

In this CMOS image sensor, a P-well region 102 is formed on a P-type semiconductor substrate 101, for example. An element isolation film 103 is selectively formed on the surface of this P-well region 102. within the region confined by the element isolation film 103, a gate oxide film 104 is formed on the surface of the P-well region 102. On the gate oxide film 104 and almost in the center of the region confined by the element isolation film 103, the gate electrode 105 is formed. In the channel region in the surface of the P-well region 102, impurity is introduced to provide an impurity layer 106. The impurity layer 106 controls the threshold voltage of a MOS transistor containing the gate electrode 105.

In the P-well region 102 between the element isolation film 103 and the gate electrode 105, a photodiode layer 107 is formed. The photodiode layer 107 is formed by implanting an N-type impurity into the P-well region 102. T he photodiode layer 107 is formed in self-alignment with the readout gate 105. o n the surface of the photodiode layer 107, a surface shield layer (P$^+$) 108 is formed. The surface shield layer 108 is formed by ion implanting a high concentration of a P-type impurity into the P-well region 102. This surface shield layer 108 works to prevent depletion of the surface of the photodiode layer 107 and formed in self-alignment with the gate electrode 105.

In the P-well region 102 to the opposite side of the surface shield layer 108 beyond the gate electrode 105, a drain region 109 is formed. When a voltage is applied to the gate electrode 105, the charge read out from the photodiode layer 107 is transferred to the drain region 109. The drain region 109 is formed in self-alignment with the readout gate 105. Part of the gate oxide film 104, located on the drain region 109, is removed to form a drain electrode 110 there. The charge transferred to the drain region 109 is supplied to a detector (not shown) through the drain electrode 110.

In the conventional CMOS image sensor having a photodiode layer 107 and a gate electrode 105, surface recombination (generation of dark current) in the photodiode layer 107 is prevented by forming a surface shield layer 108 on the surface of the photodiode layer 107.

This type of CMOS image sensors, however, have a surface shield layer 108 that covers all the surface of the photodiode layer 107. As a result, a region 111, which works as a potential barrier, is formed near the gate electrode 105 in the surface shield layer 108 when a voltage is applied to the gate electrode 105 to read out the charge accumulated in the photodiode layer 107. This region 111 extends above the photodiode layer 107 toward the side surface of the channel region which is formed under the gate electrode 105. Then it becomes hard to read out charge because of this potential barrier 111 when the charge is read out from the photodiode layer 107. This phenomenon poses a problem that the gate electrode 105 requires a high voltage for reading out charge from the photodiode layer 107.

BRIEF SUMMARY OF THE INVENTION

It is an object of the present invention to provide a solid-state image device and method of manufacturing the same that can prevent the generation of dark current and transfer charge in the charge accumulation layer with a low voltage.

According to a first aspect of the present invention, there is provided a solid-state image device comprising: a semiconductor layer of a first conductivity type; a charge accumulation layer of a second conductivity type formed in the semiconductor layer, the charge accumulation layer performing photoelectric conversion and accumulating charge; a gate electrode formed on an insulator film on the semiconductor layer and reading out charge in the charge accumulation layer, the gate electrode being positioned above part of the charge accumulation layer; a drain region of the second conductivity type formed in the surface of the semiconductor layer corresponding to one side of the gate electrode, to which charge read out from the charge accumulation layer is transferred by the gate electrode; a punch-through stopper region of the first second conductivity type formed between the drain region and the charge accumulation layer; and a shield layer of the first conductivity type formed on the surface of the semiconductor layer corresponding to another side of the gate electrode, the shield layer contacting a surface of the charge accumulation layer.

According to a second aspect of the present invention there is provided a solid-state image device comprising: a semiconductor layer of a first conductivity type; a gate electrode formed on an insulator film on the semiconductor layer; a charge accumulation layer of a second conductivity type formed to one side of the gate electrode, the charge accumulation layer performing photoelectric conversion and accumulating charge; a drain region of the second conductivity type formed in the surface of the semiconductor layer to another side of the gate electrode, to which charge read out from the charge accumulation layer is transferred via the gate electrode; and a shield layer of the first conductivity type formed in the surface of the semiconductor layer on the charge accumulation layer, wherein the position of the charge accumulation layer is shifted from the surface shield layer toward the gate electrode.

According to a third aspect of the present invention there is provided a method of manufacturing a solid-state image device comprising the steps of: forming a gate insulator film on the surface of a semiconductor layer of a first conductivity type; forming a charge accumulation layer by implanting a second conductivity type impurity into the semiconductor layer, the charge accumulation layer performing photoelectric conversion and accumulating charge; forming an impurity layer by implanting the first conductivity type impurity into the semiconductor layer to control the threshold voltage; forming a gate electrode on the gate insulator film, the position of the gate electrode being shifted toward one end of the charge accumulation layer; forming a punch-through stopper region of the first conductivity type in the semiconductor layer, in self-alignment with the gate electrode, the punch-through stopper region confining one end of the charge accumulation layer; forming a shield layer of the first conductivity type in the semiconductor layer, in self-alignment with the gate electrode, the shield layer contacting another end of the charge accumulation layer; and forming a drain region of the second conductivity type in the semiconductor layer, in self-alignment with the gate electrode, the drain region contacting the punch-through stopper region.

According to a fourth aspect of the present invention there is provided a method of manufacturing a solid-state image device comprising the steps of: forming a gate insulator film on the surface of a first conductivity type semiconductor layer; forming an impurity layer by implanting the first conductivity type impurity into the semiconductor layer to control the threshold voltage; forming a gate electrode on the gate insulator film; forming a drain region of a second conductivity type in the semiconductor layer, in self-alignment with the gate electrode; forming a charge accumulation layer of the second conductivity type in the semiconductor layer, in self-alignment with the gate electrode, the charge accumulation layer being formed to the opposite side of the drain region beyond the gate electrode, part of the charge accumulation layer extending to a position under the gate electrode; forming a sidewall film on the wall of the gate electrode; and forming a shield layer of the first conductivity type in the semiconductor layer, in self-alignment with the sidewall film, the shield layer being displaced from the charge accumulation layer.

According to fifth aspect of the present invention there is provided a method of manufacturing a solid-state image device comprising the steps of: forming a gate insulator film on the surface of a semiconductor layer of a first conductivity type; forming an impurity layer by implanting the first conductivity type impurity into the semiconductor layer to control the threshold voltage; forming a gate electrode on the gate insulator film; forming a drain region of a second conductivity type in the semiconductor layer, in self-alignment with the gate electrode; forming a sidewall film on the wall of the gate electrode; forming a shield layer of the first conductivity type in the semiconductor layer, in self-alignment with the sidewall film; removing the sidewall film; and forming a charge accumulation layer of the second conductivity type in the semiconductor layer, in self-alignment with the gate electrode, the charge accumulation layer being formed to the opposite side of the drain region beyond the gate electrode, part of the charge accumulation layer extending to a position under the gate electrode, the charge accumulation layer being displaced from the shield layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

Other objects and further features of the present invention will become apparent from the following detailed description of the preferred embodiments when read in conjunction with the attached drawings, in which.

DETAILED DESCRIPTION OF THE INVENTION

The present invention is described in further detail below, with reference to the accompanying drawings.

[First Embodiment]

Figure 1:
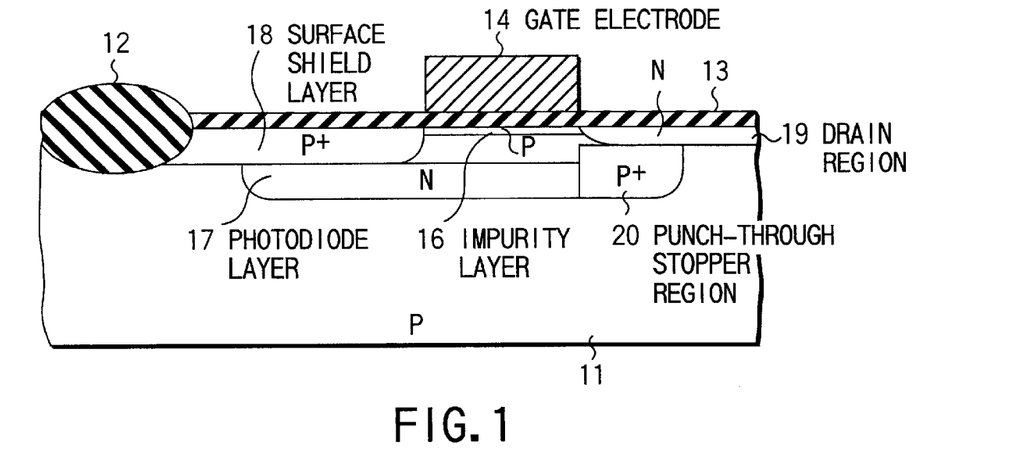
FIG. 1 is a schematic diagram illustrating the structure of a CMOS image sensor according to a first embodiment of the present invention.

Referring now to FIG. 1, a solid-state image device according to a first embodiment of the present invention is used in a CMOS image sensor. In the first embodiment of the invention, an end of the photodiode layer extends under the gate electrode. Further, a punch-through stopper region, of which impurity concentration is higher than that in the photodiode layer, is formed under the drain region. The punch-through stopper region determines the position of the end of the photodiode layer protruding under the gate electrode.

In the CMOS image sensor shown in FIG. 1, the P-type semiconductor substrate (or well region) 11, which is a semiconductor layer of the first conductivity type, has an impurity concentration of, for example, about $1\times10^{15}/cm^3$ to $1\times10^{16}/cm^3$. An element-isolating film (LOCOS: Local Oxidization Silicon) 12 is formed on a part of the surface of the substrate 11.

In the device region confined by the element isolation film 12, a gate oxide film (insulator film) 13 is formed on the surface of the semiconductor substrate 11. A gate electrode 14 made of poly-silicon, for example, is formed on the gate oxide film 13. Sidewall films can be formed, if necessary, on both sides of the gate electrode 14.

A P-type impurity layer 16 is formed in the channel region, immediate under the gate electrode 14 in the semiconductor substrate 11. The P-type impurity layer 16 controls the threshold voltage of a MOS transistor containing the gate electrode 14, and its impurity concentration is set at approx. $1\times10^{17}/cm^3$ based on the magnitude of a leak current from the photodiode layer to the drain region, which will be addressed later.

In the semiconductor substrate 11, a photodiode layer 17 (second conductivity type charge accumulation layer) is formed to accumulate the signal charge obtained by photoelectric conversion.

The photodiode layer 17 is extended from the element isolation film 12 to a position under the gate electrode 14. The photodiode layer 17 is formed by implanting an N-type impurity in the semiconductor substrate 11. The photodiode layer 17 has a depletion potential of about 1.0V. Hence, the signal charge is obtained from the photodiode layer 17 if the channel is set at potential of 1.3 to 1.5V.

A P$^+$ type surface shield 18 is formed as a first conductivity type shield layer on the surface of the semiconductor substrate 11, positioned between the gate electrode 14 and the element isolation film 12. The surface shield layer 18 is formed by ion implanting a P-type impurity into the semiconductor substrate 11 to a high concentration about $1\times10^{18}/\text{cm}^3$ to $1\times10^{19}/\text{cm}^3$, for example. The surface shield layer 18 is formed in self-alignment with the readout gate 14. The layer 18 presents surface recombination at the photodiode 17.

On the surface of the semiconductor substrate 11, which is on the opposite side of the surface shield layer 18 beyond the gate electrode 14, an N-type drain region 19 (second conductivity type signal detector) is formed. The charge read out from the photodiode layer 17 by the gate electrode 14 is transferred to this drain region 19. The drain region 19 is formed in self-alignment with the readout gate 14.

A P$^+$ punch-through stopper region 20 is formed under the drain region 19 in the semiconductor substrate 11. The punch-through stopper 20 is formed adjacent to both drain region 19 and photodiode layer 17 and prevents punch-through between the photodiode layer 17 and the drain region 19. The stopper region eliminates the punch-through phenomenon that the charge accumulated in the photodiode layer 17 is read out to the drain region 19 without control by the gate electrode 14. The impurity concentration in the punch-through stopper region 20 is set at a value higher than that in the photodiode layer 17, for example, $1\times10^{17}/\text{cm}^3$ to $1\times10^{18}/\text{cm}^3$, and the punch-through stopper region 20 is formed in self-alignment with the gate electrode 14. The position of the photodiode layer 17 under the gate electrode 14 is determined by the punch-through stopper region 20. The bottoms of the punch-through stopper region 20 and the photodiode layer 17 lie at about the same level.

In the CMOS image sensor of the above structure, the photodiode layer 17 extends under the gate electrode 14 to near the drain region 19. As a result, when a voltage is applied to the gate electrode 14, a channel is formed between the photodiode layer 17 and the drain region 19, and the charge in the photodiode layer 17 is transferred to the drain region 19 through the channel. Then it becomes possible to read out the charge in the photodiode layer 17, not affected by the potential barrier formed in the surface shield layer 18. It is, therefore, unnecessary to apply a high voltage to the gate electrode 14 when reading the charge, and the charge in the photodiode layer 17 can be read out with a low voltage.

Referring now to FIGS. 2A to 2D, a method of manufacturing the CMOS image sensor of FIG. 1 is described. In FIGS. 2A to 2D, same numerals refer to same components in FIG. 1.

Figure 2A:
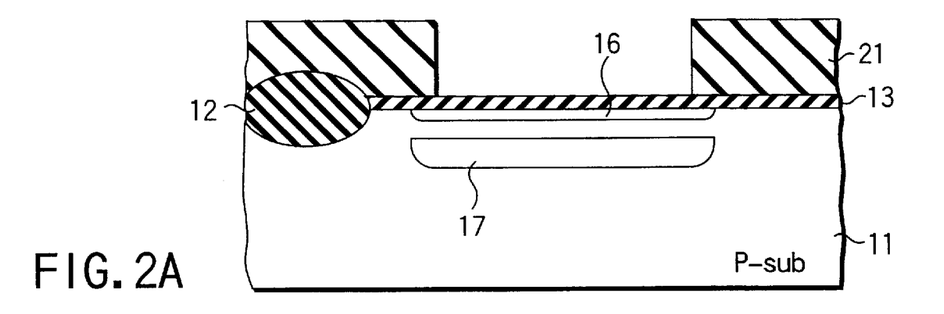
FIGS. 2A to 2D are cross sectional views illustrating a method of manufacturing the CMOS image sensor of FIG. 1.

As shown in FIG. 2A, the element isolation film 12 is formed on the primary surface of a P-type semiconductor substrate 11. Later, a gate oxide film 13 is formed on the surface of the semiconductor substrate 11, which corresponds to device area. As a next step, using a photoresist film 21 as a mask, an N-type impurity, for example, phosphorous (P) is ion implanted to a predetermined depth through the gate oxide film 13, to form a photodiode layer 17. Part of this photodiode layer 17 extends beyond the gate electrode, which will be formed later. Next, using the photoresist film 21 as a mask, a P-type impurity, for example, boron (B), is ion implanted into the surface of the semiconductor substrate 11 to form the impurity layer 16 that controls the threshold voltage of MOS transistor 14.

Figure 2B:
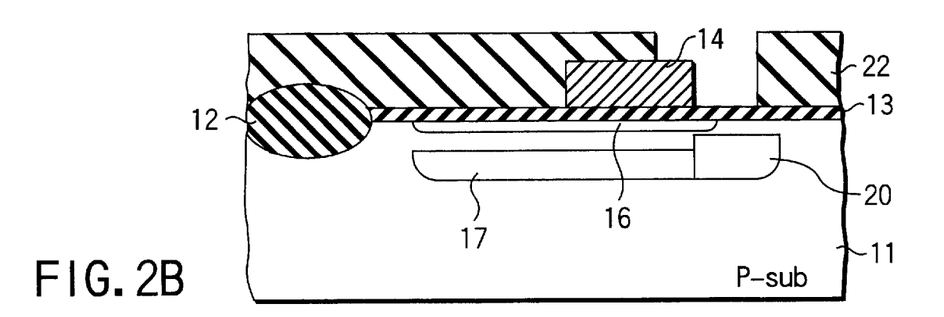

Then as shown in FIG. 2B, the photoresist 21 is removed, and a poly-silicon film is deposited on the gate insulator film 13 by the CVD (Chemical Vapor Deposition) method, for example. The poly-silicon film is etched with a photoresist film (not shown) as a mask to form a gate electrode 14. The gate electrode 14 is positioned off the center on the photodiode layer 17, to the opposite side of the element isolation film 12.

Next, as shown in FIG. 2B, a photoresist film 22 is formed on the semiconductor substrate 11. The photoresist film 22 is patterned so that part of the gate electrode 14 and part of the gate oxide film 13 are exposed. Using the photoresist film 22 and gate electrode 14 as a mask, a P-type impurity, for example, boron, is ion implanted to a predetermined depth. In this way, a punch-through stopper 20 is formed with its spread being restricted by the gate electrode 14.

Then one of the end of the photodiode layer 17 is confined by the punch-through stopper 20. As a result, the end of the photodiode layer 17 and the sidewall of the gate electrode 14 can be placed at the same position, not affected by possible mask positioning error.

Figure 2C:
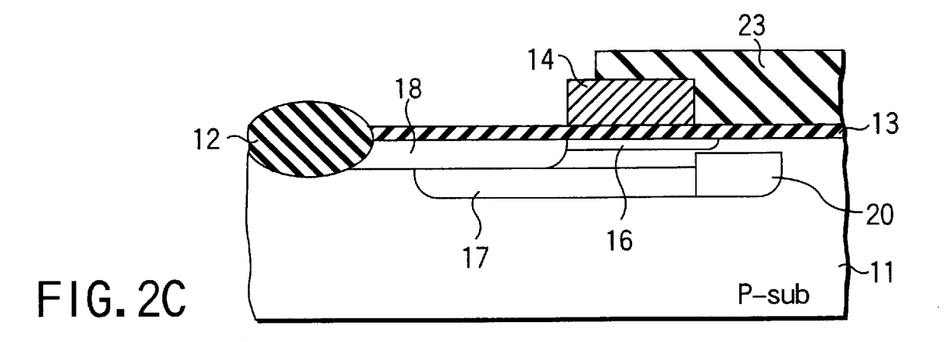

After the above photoresist film 22 is removed, as shown in FIG. 2C, a photoresist film 23 is formed on the semiconductor substrate 11. This photoresist film 23 is patterned so that it covers the area that will be a drain region 19, and part of the gate electrode 14 and the area that will be a surface shield region 18 are exposed. Using the photoresist film 23 and gate electrode 14 as a mask, a P-type impurity, for example, a high concentration of boron, is ion implanted. The surface shield layer 18 is formed in self-alignment with the readout gate 14.

Figure 2D:
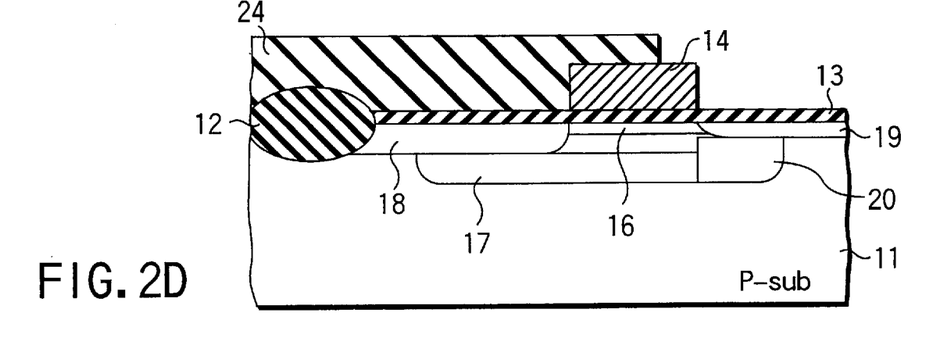

Later, a photoresist film 24 is formed as shown in FIG. 2D. The photoresist film 24 is patterned so that it covers the surface shield layer 18, and part of the gate electrode 14 and the area that will be a drain region 19 are exposed. Using the photoresist film 24 and gate electrode 14 as a mask, an N-type impurity, for example, phosphorous, is ion implanted, and the drain region 19 is formed in self-alignment with the gate electrode 14. The drain region 19 contacts the top of the punch-through stopper 20.

Finally, the photoresist film 24 is removed, and a CMOS image sensor of the structure of FIG. 1 is obtained.

Sidewall films can be formed on both sides of the gate electrode 14. After the gate electrode 14 is formed, a poly-silicon film is accumulated on the whole substrate surface by the CVD method, for example. The poly-silicon film is etched, leaving sidewalls on the gate electrode 14. The sidewall films are formed in this way. The punch-through stopper region 20, surface shield layer 18 and drain region 19 are formed in self-alignment with the sidewall films.

In the first embodiment, the punch-through stopper region 20 is formed in self-alignment with the readout gate 14, determining the position of the edge of the photodiode layer 17. Then, the drain region 19 is formed. As a result, the photodiode layer 17 does not contact the drain region 19 even if the photodiode later 17 extends under the gate electrode 14. Then the current leak from the photodiode layer 17 to the drain region 19 is prevented, even if there is a positioning error in fabricating the photodiode layer 17.

Further, when reading charge, the signal charge accumulated in the photodiode layer 17 is transferred to the drain region 19, not passing the potential barrier. The charge in the photodiode layer 17, therefore, can be transferred without applying a high voltage to the reading gate 14. Generation of an afterimage can also be prevented because all the charge in the photodiode layer 17 is completely transferred.

The photodiode layer 17 is completely depleted after the accumulated charge has been transferred to the drain region 19. Then the reset operation of the photodiode layer 17 becomes unnecessary, and the signal charge readout time can be shortened with no reset noise.

If the photodiode layer 17 and the punch-through stopper region 20 are formed only near the gate electrode 14, the capacitance associated with the PN junction can be reduced, and then degradation in sensitivity can be prevented. As a result, noise-free signal can be completely transferred with a low voltage, and the image quality is improved.

In the first embodiment, the photodiode layer may be provided in self-alignment with the source, drain and gate regions. It is further possible to form the drain region and the punch-through stopper region 20 with the same mask. Then the manufacturing process will be simplified.

[Second Embodiment]

Figure 3:
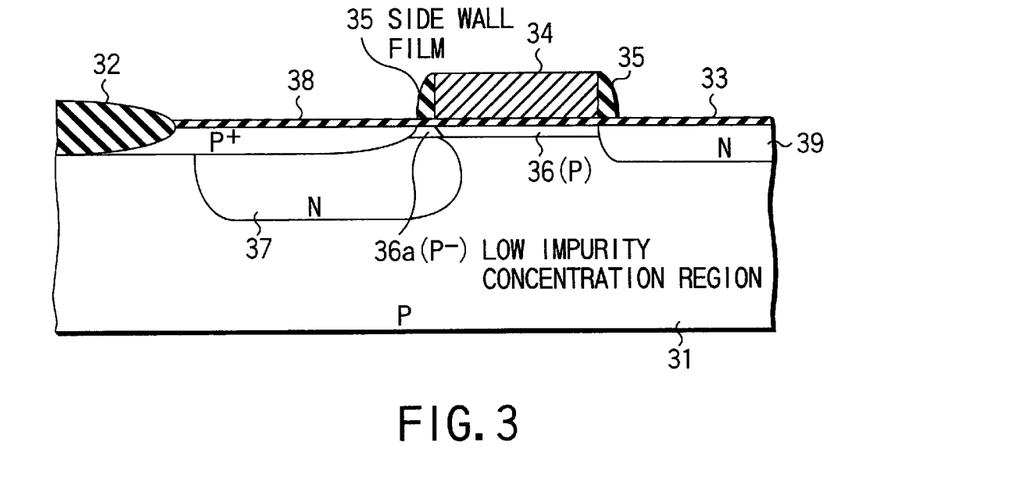
FIG. 3 is a schematic diagram illustrating the structure of a CMOS image sensor according to a second embodiment of the present invention.

Referring now to FIG. 3, a solid-state image device according to a second embodiment of the resent invention is used in a CMOS image sensor. In the second embodiment of the invention, the position of the photodiode layer is shifted from that of the surface shield layer to provide an offset area. Also the impurity profile in the photodiode layer is optimized to make the signal charge in the photodiode layer move to its surface with ease.

In the CMOS image sensor shown in FIG. 3, the P-type semiconductor substrate 31 (or well region) as a first conductivity type semiconductor layer has an impurity concentration about $1 \times 10^{15}/cm^3$ to $1 \times 10^{16}/cm^3$, for example. An element isolation film (LOCOS: LOCal Oxidization of Silicon) 32 is selectively formed on the surface of this semiconductor substrate 31.

In the element region which is confined by the element isolation film 32, a gate oxide film (insulator film) 33 is formed on the surface of the semiconductor substrate 31. A gate electrode 34 made of poly-silicon, for example, is formed on this gate oxide film 33. Sidewall films 35 are formed on both sidewalls of the gate electrode 34.

A P-type impurity layer 36 is formed on the surface of part (channel region) of the semiconductor substrate 31, which is positioned under the gate electrode 34. The P-type impurity layer 36 controls the threshold voltage of the MOS transistor 34, and its impurity concentration is set at $1 \times 10^{17}/cm^3$, for example, based on the magnitude of the leak current from the photodiode layer to the drain region, which will be referred to later.

In the semiconductor substrate 31, a photodiode layer 37 (second conductivity type charge accumulation layer) is formed in self-alignment with the gate electrode 34, which accumulates signal charge obtained by photoelectric conversion. It should be noted that part of this photodiode layer 37 extends to a position under the gate electrode 34. The photodiode layer 37 is formed by ion implanting an N-type impurity on the skew onto the region of the semiconductor substrate 31 between the element isolation film 32 and the gate electrode 34. Part of the photodiode layer 37 overlaps part of the P-type impurity layer 36. A depletion potential of the photodiode layer 37 is set to approx. 1.0 volt. In this case, the charge is read from the photodiode layer 17 by setting a potential of the channel as 1.3 to 1.5 volt.

The impurity concentration in the photodiode layer 37 is lower than that in the P-type impurity layer 36, and the impurity concentration becomes gradually high toward the surface of the semiconductor substrate 31. The manufacturing process for the photodiode layer 37 will be described in detail later.

In the surface part of the semiconductor substrate 31 between the gate electrode 34 and the element isolation film 32, a $P^+$ type surface shield layer 38 is formed. The surface shield layer 38 is formed by ion implanting a P-type impurity of a high concentration of $1 \times 10^{18}/cm^3$ to $1 \times 10^{19}/cm^3$, for example, into the substrate 31. The surface shield layer 38 prevents surface recombination on the surface of the photodiode layer 37.

The surface shield layer 38 is formed in self-alignment with the sidewall film 35. The layer 38 is displaced a little from the photodiode layer 37.

A low-impurity concentration region ($P^-$) 36a is provided under the sidewall that is adjacent to the surface shield layer 38. At the region 36a, the photodiode layer 37, the impurity layer 36 and a diffusion layer (not shown) extending from the surface shield layer 38 overlap one another. The low-impurity concentration region 36a has a lower impurity concentration than the impurity layer 36 and the surface shield layer 38.

On the other hand, in part of the semiconductor substrate 31, which is positioned to the opposite side of the surface shield layer 38 beyond the gate electrode 34, an N-type drain region (second conductivity type signal detector) 39 is formed. The charge read out from the photodiode layer 37 by the gate electrode 34 is transferred to the drain region 39. The drain region 39 is formed in self-alignment with the gate electrode 34.

Figure 4A:
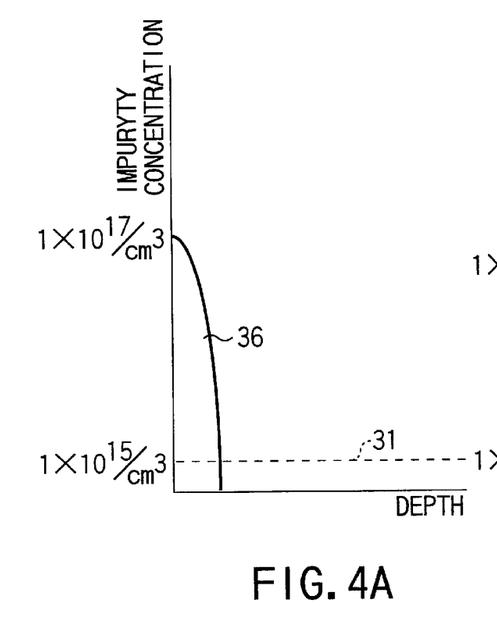
FIGS. 4A to 4D are characteristics diagrams each showing the impurity concentration profile of each part of the CMOS image sensor of FIG. 3.

FIGS. 4A to 4D illustrate the impurity concentration profile of each part of the CMOS image sensor. FIG. 4A shows the impurity profile in the P-type impurity layer 36, FIG. 4B the impurity profile in the photodiode layer 37, FIG. 4C the impurity profile in the low impurity concentration region 36a, and FIG. 4D the impurity profile in the surface shield layer 38.

As demonstrated by FIGS. 4A to 4D, the photodiode layer 37 has a profile in which the impurity concentration decreases toward its bottom. Further, the low impurity concentration region 36a has an impurity concentration that is lower than those of the impurity layer 36 and the surface shield layer 38.

In this case, since the photodiode layer 37 is formed so that it overlaps the impurity layer 36, the impurity concentration of the low impurity concentration region 36a is substantially determined by the impurity concentrations of the impurity layer 36 and the photodiode layer 37.

In such a CMOS image sensor where a surface shield layer 38 is formed adjacent to the gate electrode 34, there is no large potential barrier, which appears in the conventional CMOS structure, in the offset area between the photodiode layer 37 and the surface shield layer 38. Signal charge in the photodiode layer 37, therefore, can move to the low impurity concentration region 36a with ease, controlled by the gate electrode 34.

On the other hand, the depletion layer in the photodiode layer 37 does not reach the substrate surface, blocked by the impurity layer 36 and the low impurity concentration region 36a. As a result, without applying a high voltage upon charge readout, the noise-free signal charge in the photodiode layer 37 is completely read out and transferred to the drain region 39.

Figure 4B:
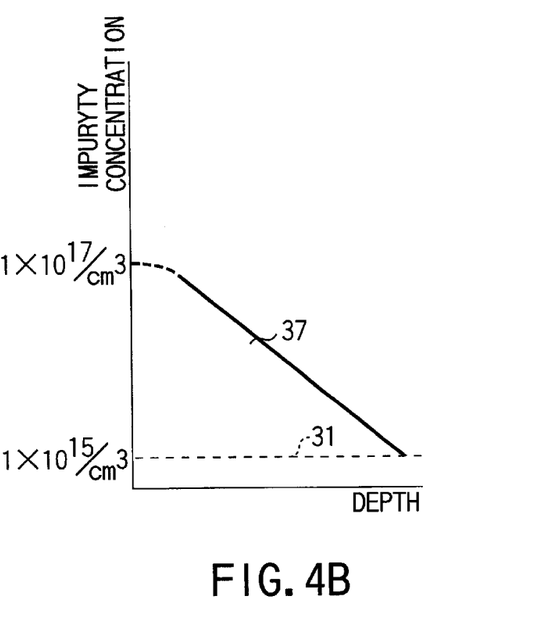
Figures 4C, 4D:
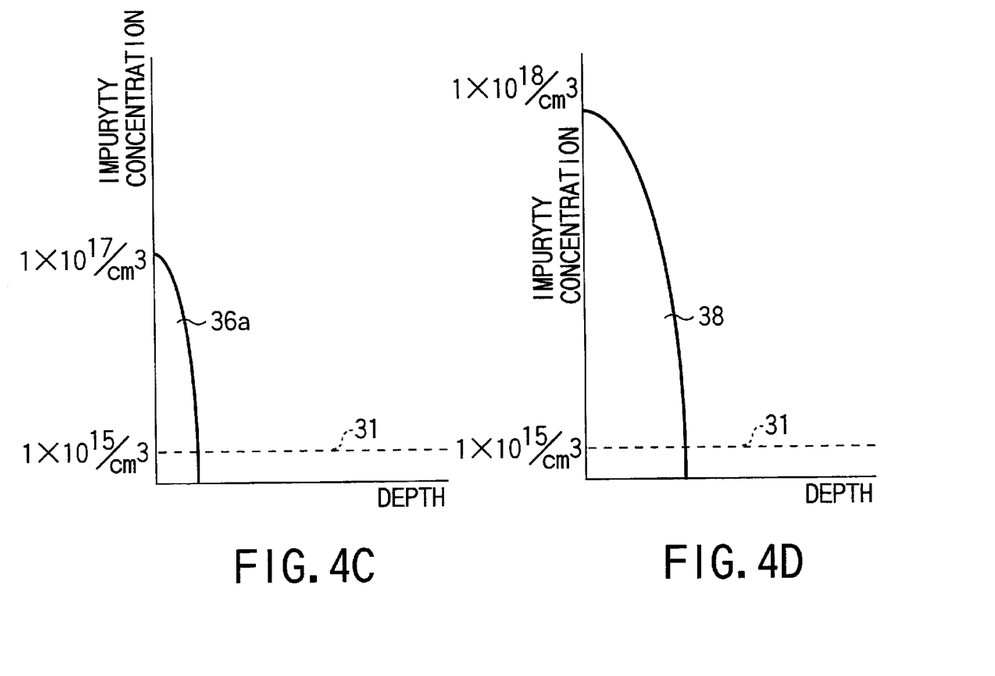

In particular, since the photodiode layer 37 has an impurity profile in which the impurity concentration decreases toward its bottom, as shown in FIG. 4B, the signal charge in the photodiode layer 37 can easily move to the low impurity concentration region 36a in the substrate surface.

Note that the dashed line in FIG. 4B indicates that impurity is implanted in the impurity layer 36 and the surface shield layer 38.

Figure 5A:
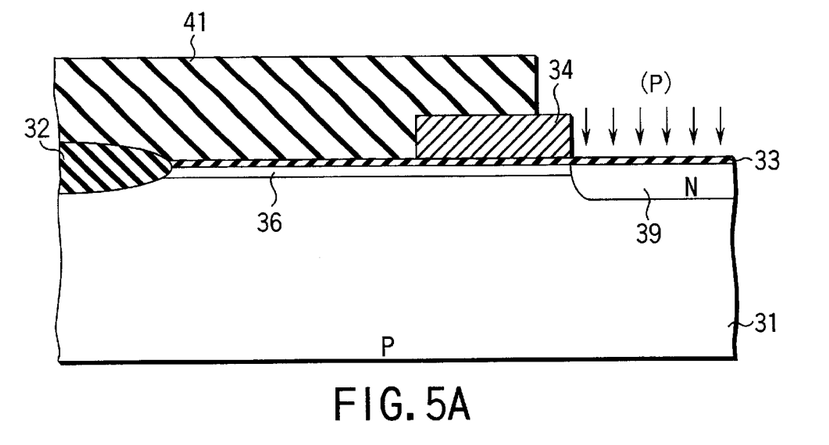
FIGS. 5A to 5C are cross sectional views illustrating a method of manufacturing the CMOS image sensor of FIG. 3.
Figure 5B:
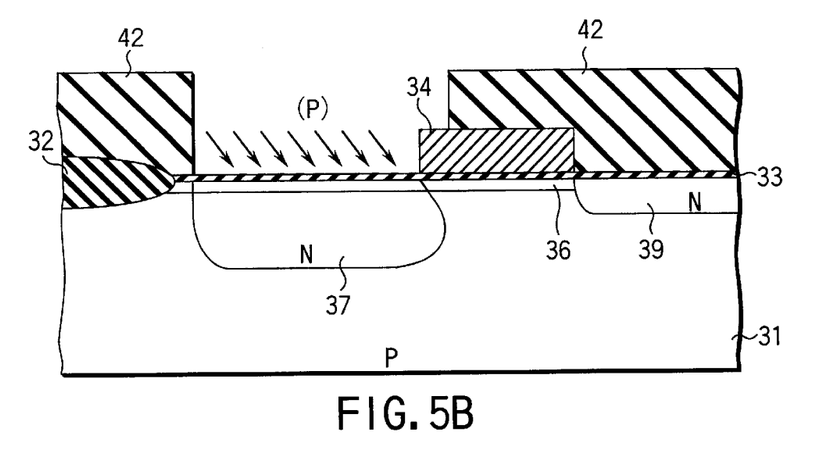
Figure 5C:
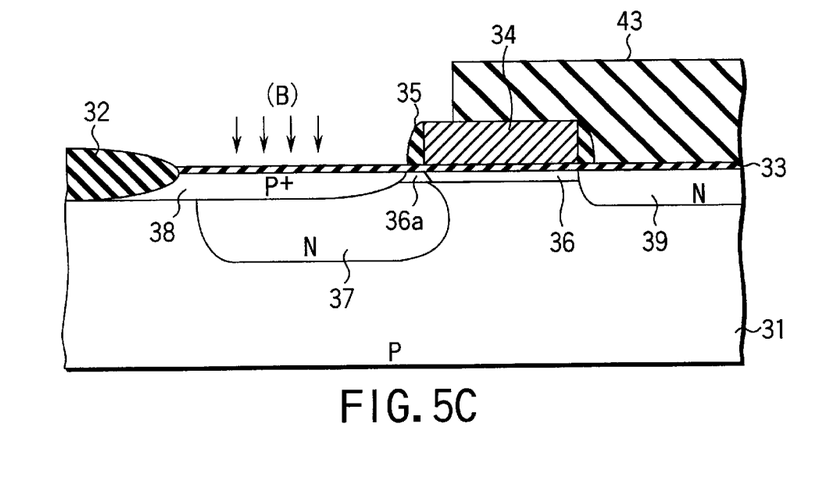

Referring now to FIGS. 5A to 5C, a manufacturing method for the CMOS image sensor of FIG. 3 is described. Same numerals refer to same components as in FIG. 3.

First as described in FIG. 5A, the element isolation film 32 is formed on the primary surface of the P-type semiconductor substrate 31. Later, the gate oxide film 33 is formed on part of the surface of the semiconductor substrate 31, which is the element area. Through the gate oxide film 33, a P-type impurity, for example, boron (B), is ion implanted into the surface of the semiconductor substrate 31 to form an impurity layer 36 which controls the threshold voltage of the MOS transistor.

Next, a poly-silicon film is deposited on the gate oxide film 33 by the CVD method, for example. This poly-silicon film is etched with a photoresist film (not shown) as a mask to form a gate electrode 34.

Next, a photoresist film 41 is formed on the semiconductor substrate 31. The photoresist film 41 is etched so that part of the gate electrode 34 and the region that will be the drain region 39 are exposed. Using the photoresist film 41 and the gate electrode 34 as a mask, an N-type impurity, for example, phosphorous (P), is ion implanted into the semiconductor substrate 31, and the drain region 39 is formed.

Subsequently, as shown in FIG. 5B, after the photoresist film 41 is removed, another photoresist film 42 is formed on the semiconductor substrate 31. This photoresist film 42 is etched so that it may cover the drain region 39, and part of the gate electrode 34 and the region that will be the photoresist region 37 are exposed. Using the photoresist film 42 and the gate electrode 34 as a mask, an N-type impurity, for example, phosphorous (P), is ion implanted into the semiconductor substrate 31 to a predetermined depth. The photodiode layer 37 is thereby formed in self-alignment with the gate electrode 34.

In this case, the N-type impurity is ion implanted on the skew so that part of the photodiode layer 37 may extend to a position under the gate electrode 34. The ion implantation is performed on the photodiode layer 37 in several steps in order to vary the implantation energy at each step to provide an impurity profile in which the impurity concentration increases toward the substrate surface.

Next, as shown in FIG. 5C, after the photoresist film 42 is removed, a silicon nitride film is deposited on the whole surface by the CVD method, for example. Sidewall film 35 is formed on the side of the gate electrode 34 by etching the silicon nitride film.

Next, as shown in FIG. 5C, a photoresist film 43 is formed on the semiconductor substrate 31. The photoresist film 43 is patterned so that it may cover the drain region 39, and expose one of the sidewall films 35 and the area which will be the surface shield layer 38. Using this photoresist film 43 and the sidewall film 35 as a mask, a P-type impurity, for example, boron (B) is ion implanted to provide a high concentration. Then a surface shield layer 38 is formed in self-alignment with the sidewall film 35. At this point, a low impurity concentration region 36a of which impurity concentration is lower than that in the impurity layer 36 is formed in the offset area next to the photodiode layer 37.

Subsequently, the photoresist film 43 is removed and the CMOS image sensor of FIG. 3 is completed.

Although the drain region 39 is formed before the sidewall film 35 is formed, the drain region 39 can be formed after the sidewall film 35 is formed.

In the second embodiment of the invention, the low impurity concentration region 36a has been formed in the offset area between the photodiode layer 37 and the surface shield layer 38. As a result, when a voltage is applied to the gate electrode 34 upon charge readout, the charge in the photodiode layer 37 is transferred to the drain region 39 via the low impurity concentration region 36a and a channel formed under the gate electrode 34. Since the charge in the photodiode layer 37 does not need to pass the potential barrier, it is unnecessary to apply a high voltage to the gate electrode 34.

Further, the impurity profile in the photodiode layer 37 is such that the impurity concentration gradually increases toward the substrate surface. As result, even if the voltage applied to the gate electrode 34 is low, the signal charge in the photodiode layer 37 is read out and transferred to the drain region 39. Since the impurity profile in the photodiode layer 37 is set as above, signal charge can move to the substrate surface along the potential. The signal charge in the photodiode later 37 can also be read out efficiently, and it can be sent to the drain region 39 completely. Afterimage, thereby, can be eliminated.

The photodiode layer 37 is completely depleted after the accumulated charge is transferred to the drain region 39. Then since the reset of the photodiode layer 37 becomes unnecessary, reset noise is eliminated and the time for signal readout can be shortened.

Figure 6:
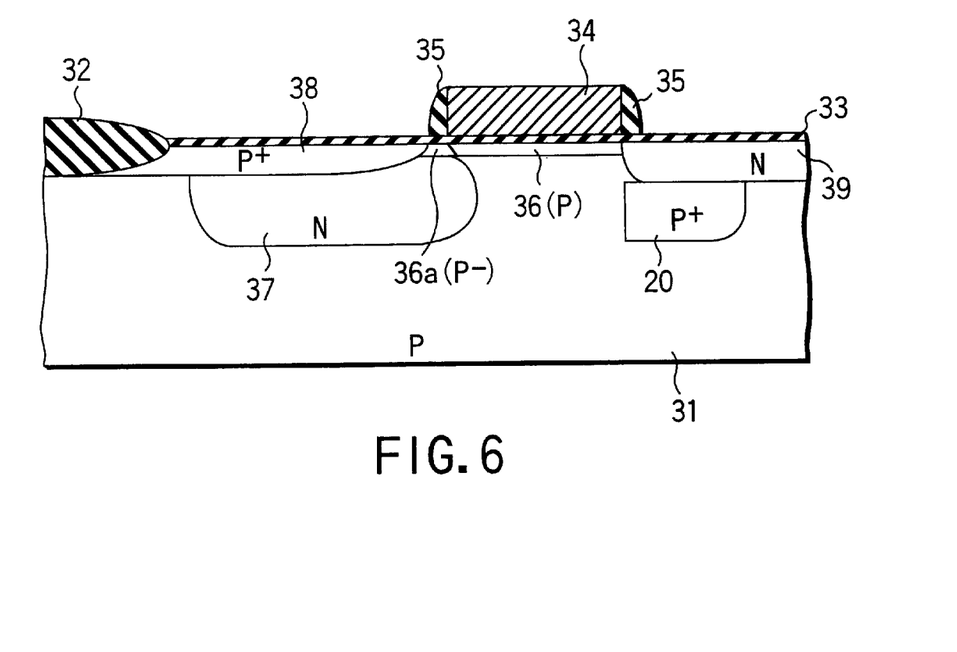
FIG. 6 is a cross sectional view of another form of the CMOS image sensor of FIG. 3.

FIG. 6 shows a variation of the second embodiment, where same components have same numerals as in FIG. 3. only differences from FIG. 3 are explained below. As shown in FIG. 6, a $P^+$ type punch-through stopper region 20 is formed under the drain region 39, in self-alignment with the gate electrode 34. This structure can reduce punch-through between the photodiode layer 37 and the drain region 39.

[Third Embodiment]

Figure 7A:
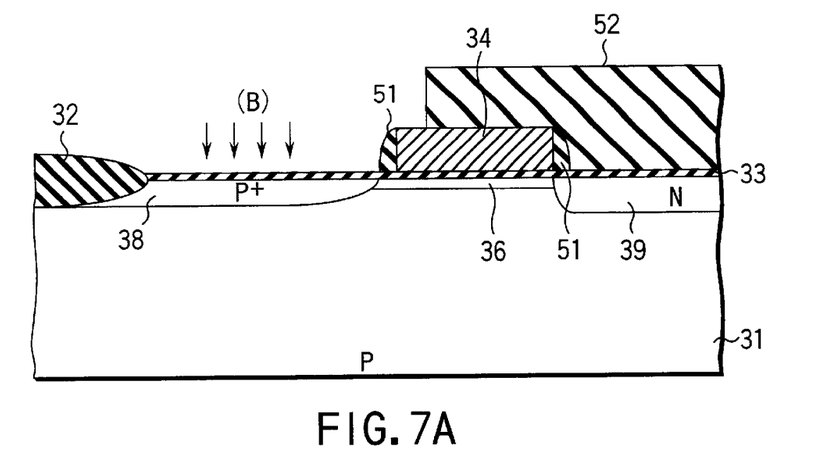
FIGS. 7A to 7C are cross sectional views illustrating a method of manufacturing the CMOS image sensor of FIG. 3.
Figure 7B:
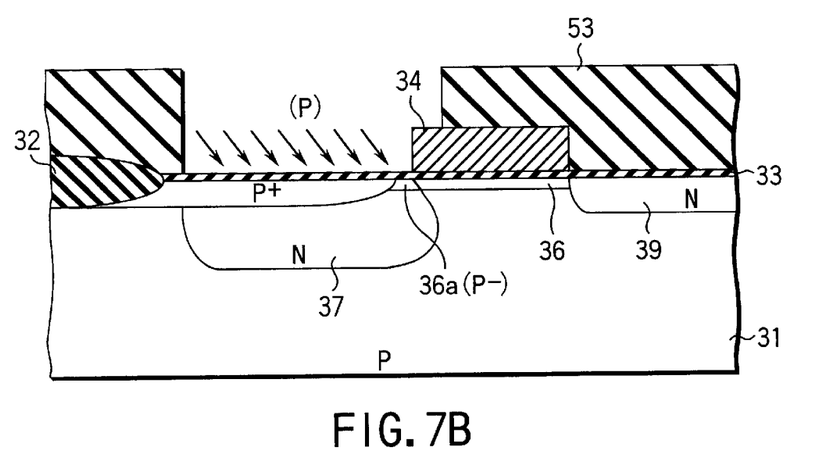
Figure 7C:
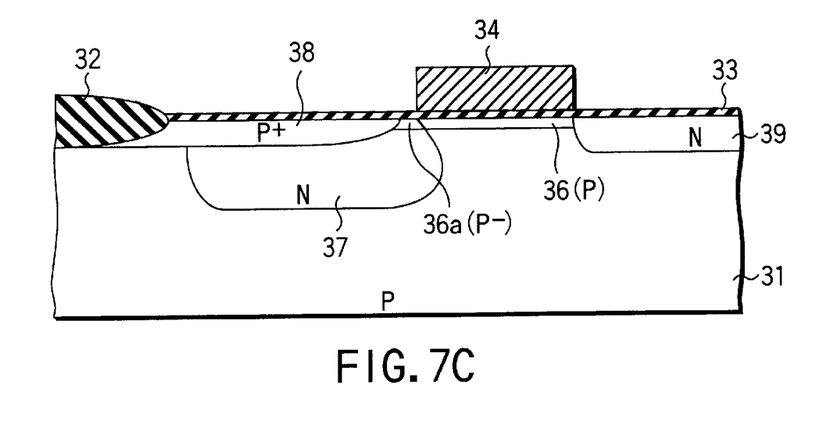

FIGS. 7A to 7C illustrate a manufacturing method according to a third embodiment of the resent invention.

Referring now to FIG. 7C, the structure of a CMOS image sensor according to a third embodiment of the invention is described. The structure of the CMOS image sensor of the third embodiment of the invention is featured by a gate electrode 34 that has no sidewall films, as shown in FIG. 7C. When the sidewall film 35 made of poly-silicon is formed on the sidewall of the gate electrode 34 as the case of the second embodiment, the sidewall film 35 may hold charge in some cases. Then the threshold voltage of the gate electrode 34 is affected, and it may become difficult to ensure the readout of change in the photodiode layer 37 through the low impurity concentration region 36a. It may also be possible to use another insulator, for example, silicon nitride, as a material for the sidewall film 35. Then charge is not accumulated in the sidewall film. In this case, however, a crystal defect may take place in the substrate surface because of distortion in the sidewall film and result in a current leak from this crystal defect. In the third embodiment, therefore, the sidewall film has been removed.

Referring now to FIGS. 7A to 7C, a manufacturing method for a CMOS image sensor of the third embodiment is described below. In the third embodiment, the manufacturing processes until forming the drain region 39 are all the same as those in the second embodiment explained with FIG. 5A. Description of those processes are thus omitted below.

As illustrated by FIG. 7A, after a drain region 39 is formed, a silicon oxide film (not shown) is formed on a surface of the gate electrode 34. Then, a poly-silicon film is deposited on entire surface of the substrate by the CVD method, for example. The poly-silicon film is etched by the RIE method, for example, and sidewall films 51 are formed on both sides of the gate electrode 34. Later, a photoresist film 52 is formed on the semiconductor substrate 31. This photoresist film 52 covers the drain region 39, and is patterned so that one sidewall film 51 and the surface shield layer 36 may be exposed. Using the photoresist film 52 and the sidewall film 51 as a mask, a P-type impurity, for example, boron (B), is ion implanted to a high concentration. Then a surface shield layer 38 is formed in self-alignment with sidewall film 51.

Next, as shown in FIG. 7B, after the photoresist film 52 is removed, the sidewall films 51 is removed by the CDE method, for example. Later, another photoresist film 53 is formed. This photoresist film 53 is patterned so that it may cove the drain region 39, and expose part of the gate electrode 34 and the area which will be the photodiode 37. Using this photoresist film 53 and the gate electrode 34 as a mask, an N-type impurity, for example, phosphorous (P), is ion implanted to a predetermined depth. Then a photodiode layer 37 is formed in self-alignment with the gate electrode 34.

In this case, the N-type impurity is ion implanted on the skew so that part of the photodiode layer 37 may extend to a position under the gate electrode 34. The ion implantation can be performed on the photodiode layer 37 in several steps to vary the implantation energy at each step to provide an impurity profile in which the impurity concentration increases toward the substrate surface. In this way, in the offset area between the surface shield layer 38 and the photodiode layer 37, a low impurity concentration region 36a is formed with an impurity concentration that is lower than that in the impurity layer 36.

Next, the photoresist film 53 is removed to complete the CMOS image sensor.

In the third embodiment of the invention, the gate electrode 34 does not have sidewall films on its sides. Therefore, the threshold voltage of the gate electrode 34 is not affected by charge that may be accumulated in the sidewall films, and evolution of a crystal defect in the substrate surface is prevented. As a result, upon reading charge, the charge accumulated in the photodiode layer 37 can be transferred with reliability to the drain region 39 via the low impurity concentration region 36a, corresponding to the voltage applied to the gate electrode 34.

In the third embodiment, the drain region 39 was formed, before forming the sidewall film 51. Alternatively, the drain region 39 may be formed after removing the sidewall film 35 and forming the photodiode layer 37, as shown in FIG. 7B. In this case, the surface shield layer 38, the photodiode layer 37, and a part of gate electrode 34 are covered with a photoresist film (not show). Using the photoresist film and the part of gate electrode 34 as a mask, a N type impurity, for example Phosphors (P), is implanted into the semiconductor substrate 31, thereby forming the drain region 39.

Having described and illustrated the principles of the invention in preferred embodiments 1–3, it is appreciated by those having skill in the art that the invention can be modified in arrangement and detail without departing from such principles. For example, it is also possible to apply the present invention to CCD image sensors and linear sensors, although an application to CMOS image sensors has been described in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state image device comprising:
   a semiconductor layer of a first conductivity type;
   a charge accumulation layer of a second conductivity type formed in said semiconductor layer, the charge accumulation layer performing photoelectric conversion and accumulating charge;
   a gate electrode formed on an insulator film on the semiconductor layer, the gate electrode being positioned above part of the charge accumulation layer;
   a drain region of the second conductivity type formed in the surface of the semiconductor layer corresponding to one side of the gate electrode, to which charge read out from the charge accumulation layer is transferred;
   a punch-through stopper region of the first conductivity type formed between the drain region and the charge accumulation layer and corresponding to only one side of the gate electrode; and
   a shield layer of the first conductivity type formed in the surface of the semiconductor layer corresponding to another side of the gate electrode, the shield layer contacting a surface of the charge accumulation layer.

2. The device according to claim 1, wherein one end of the charge accumulation layer is confined by the punch-through stopper region.

3. The device according to claim 1, wherein the punch-through stopper region is formed in self-alignment with the gate electrode.

4. The device according to claim 1, wherein the shield layer is formed in self-alignment with the gate electrode.

5. The device according to claim 1, wherein the bottom of the charge accumulation layer stands at about the same level of the bottom of the punch-through stopper region.

6. A sold-state image device comprising:
   a semiconductor layer of a first conductivity type;
   a gate electrode formed on an insulator film on the semiconductor layer;
   a charge accumulation layer of a second conductivity type formed in the semiconductor layer corresponding to one side of the gate electrode, the charge accumulation layer performing photoelectric conversion and accumulating charge;
   a drain region of the second conductivity type formed in the surface of the semiconductor layer to another side of the gate electrode, to which charge read out from the charge accumulation layer is transferred via the gate electrode;
   a shield layer of the first conductivity type formed in the surface of the semiconductor layer on the charge accumulation layer, wherein the position of the charge accumulation layer is shifted from the surface shield layer toward the gate electrode;
   an impurity layer of the first conductive type formed under the gate electrode in the semiconductor layer; and
   a low impurity concentration layer of the first conductive type formed between the charge accumulation layer and the impurity layer.

7. The device according to claim 6, wherein said impurity layer determines the threshold voltage of the gate electrode.

8. The device according to claim 6, wherein the impurity concentration in the charge accumulation layer decreases toward its bottom.

9. The device according to claim 6, wherein part of the charge accumulation layer extends to a position under the gate electrode.

10. The device according to claim 6, wherein the charge accumulation layer is formed in self-alignment with the gate electrode, and the shield layer is formed in self-alignment with a sidewall film on the gate electrode.

11. The device according to claim 6, further comprising a punch-through stopper region of the first conductivity type formed under the drain region in the semiconductor layer.

12. The device according to claim 6, wherein a concentration of the low impurity concentration layer is lower than that of the impurity layer.

13. A solid-state image device comprising:

a semiconductor layer of a first conductivity type;

a gate electrode formed on an insulator film on the semiconductor layer;

a charge accumulation layer of a second conductivity type formed in said semiconductor layer, a first portion of which is positioned below the gate electrode, the charge accumulation layer performing photoelectric conversion and accumulating charge;

a drain region of the second conductivity type formed in the surface of the semiconductor layer corresponding to a first side of the gate electrode, to which charge read out from the charge accumulation layer is transferred;

a punch-through stopper region of the first conductivity type formed between the drain region and the first portion of the charge accumulation layer and corresponding to only one side of the gate electrode; and a shield layer of the first conductivity type formed in the surface of the semiconductor layer corresponding to a second side of the gate electrode, the shield layer contacting a second portion of the charge accumulation layer.

* * * * *